(12) United States Patent
Zheng

(10) Patent No.: US 11,011,093 B2
(45) Date of Patent: May 18, 2021

(54) SHIFT REGISTER UNIT, METHOD FOR DRIVING SHIFT REGISTER UNIT, GATE DRIVING CIRCUIT, METHOD FOR DRIVING GATE DRIVING CIRCUIT, AND DISPLAY DEVICE

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/619,308

(22) PCT Filed: Jul. 19, 2018

(86) PCT No.: PCT/CN2018/096221
§ 371 (c)(1),
(2) Date: Dec. 4, 2019

(87) PCT Pub. No.: WO2019/015630
PCT Pub. Date: Jan. 24, 2019

(65) Prior Publication Data
US 2020/0143731 A1 May 7, 2020

(30) Foreign Application Priority Data
Jul. 20, 2017 (CN) .......................... 201710597800.X

(51) Int. Cl.
*G09G 3/20* (2006.01)
*G11C 19/28* (2006.01)
(52) U.S. Cl.
CPC ............... *G09G 3/20* (2013.01); *G11C 19/28* (2013.01); *G09G 2310/0286* (2013.01)
(58) Field of Classification Search
CPC ... G09G 3/20; G09G 2310/0286; G11C 19/28
See application file for complete search history.

(56) References Cited

U.S. PATENT DOCUMENTS 9,799,272 B2 * 10/2017 Zhang .................. G09G 3/3266
9,997,101 B2 * 6/2018 Sun ........................ G09G 3/3266
(Continued)

FOREIGN PATENT DOCUMENTS

CN 102760409 A 10/2012
CN 103208251 A 7/2013
(Continued)

OTHER PUBLICATIONS

Office Action of CN Application No. 201710597800.X and translation, dated Apr. 30, 2019, 11 pages.
(Continued)

*Primary Examiner* — William Lu
(74) *Attorney, Agent, or Firm* — Muncy, Geissler, Olds & Lowe, P.C.

(57) ABSTRACT

A shift register unit, a driving method, a gate driving circuit and a display device are provided. The shift register unit includes: a starting circuit configured to control, under control of a first clock signal input terminal, turning on or off coupling between a first node and a starting voltage input terminal; a first capacitor circuit, having a first terminal being coupled to a second clock signal input terminal, and a second terminal being coupled to the first node; a first node control circuit configured to control, under control of a third node, turning on or off coupling between the first node and a first level input terminal; a potential control circuit configured to control, under control of the first node, turning on or off coupling between the second node and a second level input terminal; a second capacitor circuit; a second node control circuit; an output circuit; and a third node control circuit.

18 Claims, 2 Drawing Sheets

(56) References Cited

U.S. PATENT DOCUMENTS

| | | | |
|---|---|---|---|
| 10,438,541 B2* | 10/2019 | Wang | G09G 3/3266 |
| 10,453,546 B2* | 10/2019 | Sun | G11C 19/28 |
| 10,885,826 B2* | 1/2021 | Zheng | G09G 3/20 |
| 2008/0056430 A1 | 3/2008 | Chang et al. | |
| 2013/0321372 A1 | 12/2013 | Hung et al. | |
| 2015/0243237 A1 | 8/2015 | Li et al. | |
| 2015/0279480 A1* | 10/2015 | Murakami | G11C 19/28 345/100 |
| 2015/0325190 A1* | 11/2015 | Cao | G11C 19/28 345/100 |
| 2016/0012911 A1* | 1/2016 | Han | G09G 3/2096 377/64 |
| 2016/0086562 A1* | 3/2016 | Tan | G09G 3/3677 345/215 |
| 2016/0180800 A1* | 6/2016 | Zheng | G09G 3/20 345/213 |
| 2017/0004889 A1* | 1/2017 | Li | G09G 3/3266 |
| 2018/0108289 A1* | 4/2018 | Zheng | G09G 3/2092 |
| 2018/0174521 A1* | 6/2018 | Zheng | G11C 19/28 |
| 2018/0342187 A1* | 11/2018 | Shan | G11C 19/287 |
| 2019/0103166 A1* | 4/2019 | Yuan | G09G 3/3266 |
| 2019/0333596 A1* | 10/2019 | Zhu | G09G 3/3266 |
| 2020/0143730 A1* | 5/2020 | Zheng | G09G 3/20 |

FOREIGN PATENT DOCUMENTS

| | | |
|---|---|---|
| CN | 103413531 A | 11/2013 |
| CN | 103700355 A | 4/2014 |
| CN | 103714792 A | 4/2014 |
| CN | 104282255 A | 1/2015 |
| CN | 104464628 A | 3/2015 |
| CN | 104809978 A | 7/2015 |
| CN | 106952606 A | 7/2017 |
| CN | 107154234 A | 9/2017 |
| KR | 20140147203 A | 12/2014 |

OTHER PUBLICATIONS

International Search Report of PCT/CN2018/096221 and translation, dated Oct. 26, 2018, 17 pages.

* cited by examiner

SHIFT REGISTER UNIT, METHOD FOR DRIVING SHIFT REGISTER UNIT, GATE DRIVING CIRCUIT, METHOD FOR DRIVING GATE DRIVING CIRCUIT, AND DISPLAY DEVICE

CROSS-REFERENCE TO RELATED APPLICATION

This application is the U.S. national phase of PCT Application No. PCT/CN2018/096221 filed on Jul. 19, 2018, which claims the benefit and priority of Chinese Application No. 201710597800.X, filed on Jul. 20, 2017. The entire disclosures of the application are incorporated herein by reference.

TECHNICAL FIELD

The present disclosure relates to the field of display driving technologies, and in particular to a shift register unit, a method for driving the shift register unit, a gate driving circuit, a method for driving the gate driving circuit, and a display device.

BACKGROUND

In the display field, in order to continuously improve displayed images and improve user's experience, high-definition and high-ppi (pixel per inch) displaying has become a hot research. However, as the number of pixels increases, the number of rows that a gate driving circuit including multi-stage shift register units needs to scan in one frame display time increases. An average pulse width of a grid driving signal of each row is continuously narrowed, and this requires to continuously improve driving capability of shift registers.

SUMMARY

The present disclosure provides a shift register unit includes:

a starting circuit coupled with a first clock signal input terminal, a first node and a start voltage input terminal, respectively; wherein the starting circuit is configured to, under control of the first clock signal input terminal, control turning on or off coupling between the first node and the start voltage input terminal;

a first capacitor circuit with a first terminal coupled with a second clock signal input terminal and a second terminal coupled with the first node;

a first node control circuit coupled with a third node, a first level input terminal and the first node, respectively; wherein the first node control circuit is configured to, under control of the third node, control turning on or off coupling between the first node and the first level input terminal;

a potential control circuit coupled with the first node, a second level input terminal and a second node, respectively; wherein the potential control circuit is configured to, under control of the first node, control turning on or off coupling between the second node and the second level input terminal;

a second capacitor circuit with a first terminal coupled with the second node and a second terminal coupled with a gate drive signal output terminal;

a second node control circuit coupled with the third node, the first level input terminal and the second node, respectively;

an output circuit coupled with the second node, the third node, the gate drive signal output terminal, a third clock signal input terminal and the first level input terminal, respectively; and a third node control circuit coupled with a fourth clock signal input terminal, the second level input terminal, the second node and the third node, respectively.

In implementation, the shift register unit of the present disclosure further includes a third capacitor circuit; wherein a first terminal of the third capacitor circuit is coupled with the third node; a second terminal of the third capacitor circuit is coupled with the first level input terminal;

the second node control circuit is configured to, under control of the third node, control turning on or off coupling between the second node and the first level input terminal;

the third node control circuit is configured to, under control of the second node, control turning on or off coupling between the third node and the fourth clock signal input terminal;

the output circuit is configured to, under control of the second node, control turning on or off coupling between the gate drive signal output terminal and the third clock signal input terminal; under control of the third node, control turning on or off coupling between the gate drive signal output terminal and the first level input terminal.

In implementation, the starting circuit includes: a starting transistor; a gate electrode of the starting transistor is coupled with the first clock signal input terminal; a first electrode of the starting transistor is coupled with the first node; and a second electrode of the starting transistor is coupled with the start voltage input terminal.

In implementation, the first capacitor circuit includes a first capacitor; a first terminal of the first capacitor is coupled with the second clock signal input terminal; and a second terminal of the first capacitor is coupled with the first node.

In implementation, the first node control circuit includes a first node control transistor; a gate electrode of the first node control transistor is coupled with the third node; a first electrode of the first node control transistor is coupled with the first level input terminal; and a second electrode of the first node control transistor is coupled with the first node.

In implementation, the potential control circuit includes a potential control transistor; a gate electrode of the potential control transistor is coupled with the first node; a first electrode of the potential control transistor is coupled with the second node; and a second electrode of the potential control transistor is coupled with the second level input terminal.

In implementation, the second capacitor circuit includes a second capacitor; a first terminal of the second capacitor is coupled with the second node; and a second terminal of the second capacitor is coupled with the gate drive signal output terminal.

In implementation, the second node control circuit includes a second node control transistor; a gate electrode of the second node control transistor is coupled with the third node; a first electrode of the second node control transistor is coupled with the first level input terminal; and a second electrode of the second node control transistor is coupled with the second node.

In implementation, the third node control circuit includes a first control transistor and a second control transistor; a gate electrode of the first control transistor is coupled with the fourth clock signal input terminal; a first electrode of the first control transistor is coupled with the third node; and a second electrode of the first control transistor is coupled with the second level input terminal;

a gate electrode of the second control transistor is coupled with the second node; a first electrode of the second control transistor is coupled with the third node; and a second electrode of the second control transistor is coupled with the fourth clock signal input terminal.

In implementation, the output circuit includes a first output transistor and a second output transistor; a gate electrode of the first output transistor is coupled with the second node; a first electrode of the first output transistor is coupled with the gate drive signal output terminal; and a second electrode of the first output transistor is coupled with the third clock signal input terminal;

a gate electrode of the second output transistor is coupled with the third node; a first electrode of the second output transistor is coupled with the first level input terminal; and a second electrode of the second output transistor is coupled with the gate drive signal output terminal.

In implementation, the starting transistor, the first node control transistor, the potential control transistor, the second node control transistor, the first control transistor, the second control transistor, the first output transistor and the second output transistor are p-type transistors; the second level input terminal is a low level input terminal; and the first level input terminal is a high level input terminal.

In implementation, the starting transistor, the first node control transistor, the potential control transistor, the second node control transistor, the first control transistor, the second control transistor, the first output transistor and the second output transistor are n-type transistors; the second level input terminal is a high level input terminal; and the first level input terminal is a low level input terminal.

The present disclosure provides a method for driving the above shift register unit, which includes: in each display period, in a first stage, each of the start signal input terminal and the first clock signal input terminal receives a second level V2; each of the second clock signal input terminal, the third clock signal input terminal and the fourth clock signal input terminal receives a first level V1; the starting circuit controls the start signal input terminal to be coupled with the first node until a potential of the first node becomes V2-Vth1, where Vth1 is a threshold voltage of a starting transistor included in the starting circuit; under control of the first node, the potential control circuit controls the second node to be coupled with the second level input terminal, until a potential of the second node becomes V2-Vth1-Vth2, where Vth2 is a threshold voltage of a potential control transistor included in the potential control circuit; under control of the second node, the output circuit controls the gate drive signal output terminal to be coupled with the third clock signal input terminal, thereby enabling the gate drive signal output terminal to outputs the first level;

in a second stage, the second clock signal input terminal receives the second level V2; each of the start signal input terminal, the first clock signal input terminal, the third clock signal input terminal and the fourth clock signal input terminal receives the first level V1; since the potential of the first terminal of the first capacitor circuit is changed from V1 to V2, the potential of the first node becomes 2V2-Vth1-V1; under control of the first node, the potential control circuit controls the second node to be coupled with the second level input terminal, thereby enabling the potential of the second node to be the second level V2; under control of the second node, the output circuit controls the gate drive signal output terminal to be coupled with the third clock signal input terminal, thereby enabling the gate drive signal output terminal to output the first level V1;

in a third stage, the third clock signal input terminal receives the second level V2; each of the start signal input terminal, the first clock signal input terminal, the second clock signal input terminal and the fourth clock signal input terminal receives the first level V1; since the potential of the first terminal of the first capacitor circuit is changed from V2 to V1, so that the potential of the first node becomes V2-Vth1; under control of the first node, the potential control circuit controls the second node to be disconnected from the second level input terminal; under control of the second node, the output circuit controls the gate drive signal output terminal to be coupled with the third clock signal input terminal, so that the gate drive signal output terminal outputs the second level V2; since the potential of the second terminal of the second capacitor circuit is changed from V1 to V2, the potential of the second node jumps to 2V2-V1; and in a fourth stage, the fourth clock signal input terminal receives the second level V2; each of the start signal input terminal, the first clock signal input terminal, the second clock signal input terminal and the third clock signal input terminal receives the first level V1; under control of the fourth clock signal input terminal, the third node control circuit controls the third node to be coupled with the second level input terminal; under control of the third node, the second node control circuit controls the second node to be coupled with the first level input terminal; under control of the third node, the output circuit controls the gate drive signal output terminal to output the first level V1.

In implementation, the method of the present disclosure further includes: in the first stage, the second stage and the third stage, under control of the second node, the third node control circuit controls the third node to be coupled with the fourth clock signal input terminal, thereby enabling the potential of the third node to be the first level V1; under control of the third node, the output circuit controls the gate drive signal output terminal to be disconnected from the first level input terminal.

In implementation, each of a duty ratio of a first clock signal input into the first clock signal input terminal, a duty ratio of a second clock signal input into the second clock signal input terminal, a duty ratio of a third clock signal input into the third clock signal input terminal and a duty ratio of a fourth clock signal input into the fourth clock signal input terminal is ¼;

each of a period of the first clock signal, a period of the second clock signal, a period of the third clock signal and a period of the fourth clock signal is T;

the second clock signal is delayed by T/4 from the first clock signal, the third clock signal is delayed by T/4 from the second clock signal, and the fourth clock signal is delayed by T/4 from the third clock signal.

The present disclosure provides a gate driving circuit including M cascaded shift register units. M is an integer greater than one.

The present disclosure provides a method for driving a gate driving circuit which includes M cascaded shift register units, wherein M is an integer greater than one; the method includes:

for a (4N+1)-th shift register unit, a (4N+2)-th shift register unit, a (4N+3)-th shift register unit and a (4N+4)-th shift register unit in the M cascaded shift register units, where N is an integer greater than or equal to zero, and (4N+4) is less than or equal to the M, a first clock signal input terminal of the (4N+1)-th shift register unit receives a first clock signal; a second clock signal input terminal of the (4N+1)-th shift register unit receives a second clock signal; a third clock signal input terminal of the (4N+1)-th shift register unit receives a third clock signal; a fourth clock signal input terminal of the (4N+1)-th shift register unit receives a fourth clock signal;

a first clock signal input terminal of the (4N+2)-th shift register unit receives the second clock signal; a second clock signal input terminal of the (4N+2)-th shift register unit receives the third clock signal; a third clock signal input terminal of the (4N+2)-th shift register unit receives the fourth clock signal; a fourth clock signal input terminal of the (4N+2)-th shift register unit receives the first clock signal;

a first clock signal input terminal of the (4N+3)-th shift register unit receives the third clock signal; a second clock signal input terminal of the (4N+3)-th shift register unit receives the fourth clock signal; a third clock signal input terminal of the (4N+3)-th shift register unit receives the first clock signal; a fourth clock signal input terminal of the (4N+3)-th shift register unit receives the second clock signal; and a first clock signal input terminal of the (4N+4)-th shift register unit receives the fourth clock signal; a second clock signal input terminal of the (4N+4)-th shift register unit receives the first clock signal; a third clock signal input terminal of the (4N+4)-th shift register unit receives the second clock signal; a fourth clock signal input terminal of the (4N+4)-th shift register unit receives the third clock signal.

The present disclosure provides a display device including the gate driving circuit.

DETAILED DESCRIPTION

The technical solutions of embodiments of the present disclosure will be described hereinafter in a clear and complete manner in conjunction with the drawings of the embodiments. Obviously, the following embodiments are merely a part of, rather than all of, the embodiments of the present disclosure, and based on these embodiments, a person skilled in the art may obtain the other embodiments without creative labor, which also fall within the scope of the present disclosure.

Transistors used in the embodiments of the present disclosure may each be a thin film transistor or a field effect transistor or other devices having the same characteristics. In the embodiment of the present disclosure, in order to distinguish two electrodes of the transistor except for a gate electrode, one of the two electrodes is referred to as a first electrode, and the other one of the two electrodes is referred to as a second electrode. In actual operation, the first electrode may be a drain electrode, and the second electrode may be a source electrode; or, the first electrode may be a source electrode, and the second electrode may be a drain electrode.

Figure 1:
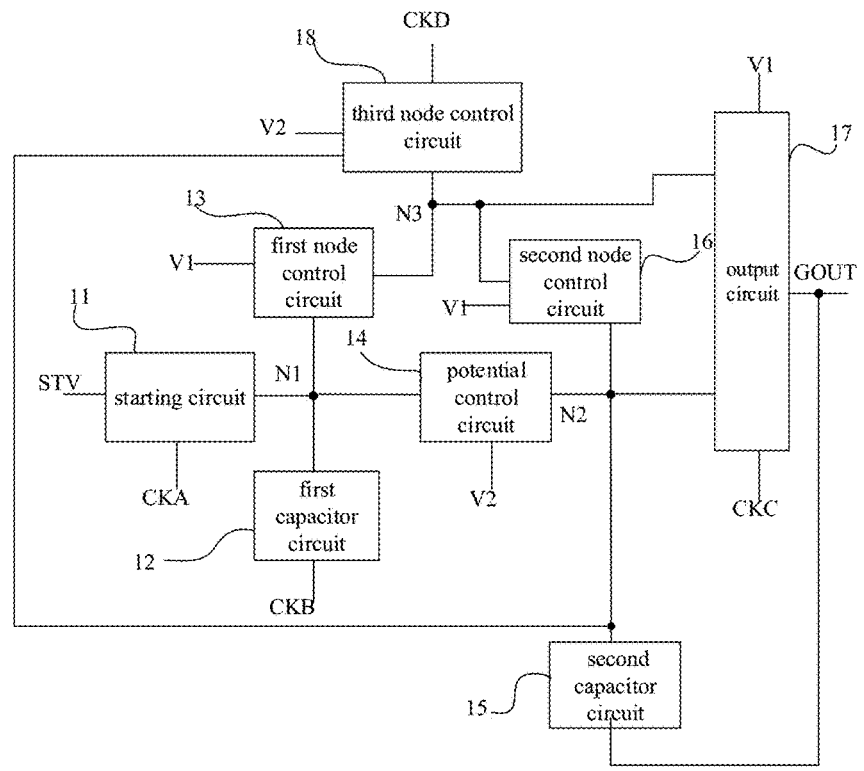
FIG. 1 is a schematic diagram of a shift register unit according to an embodiment of the present disclosure.

As shown in FIG. 1, a shift register unit according to an embodiment of the present disclosure includes: a starting circuit 11, a first capacitor circuit 12, a first node control circuit 13, a potential control circuit 14, a second capacitor circuit 15, a second node control circuit 16, an output circuit 17 and a third node control circuit 18.

The starting circuit 11 is coupled to a first clock signal input terminal CKA, a first node N1 and a start voltage input terminal STV, respectively. The starting circuit 11 is configured to, under control of the first clock signal input terminal CKA, control tuning on or off coupling between the first node N1 and the start voltage input terminal STV.

A first terminal of the first capacitor circuit 12 is coupled with a second clock signal input terminal CKB. A second terminal of the first capacitor circuit 12 is coupled with the first node N1.

The first node control circuit 13 is coupled to a third node N3, a first level input terminal for inputting a first level V1, and the first node N1, respectively. The first node control circuit 13 is configured to, under control of the third node N3, control turning on or off coupling between the first node N1 and the first level input terminal for inputting the first level V1.

The potential control circuit 14 is coupled with the first node N1, a second level input terminal for inputting a second level V2 and a second node N2, respectively. The potential control circuit 14 is configured to, under control of the first node N1, control turning on or off coupling between the second node N2 and the second level input terminal for inputting the second level V2.

A first terminal of the second capacitor circuit 15 is coupled with the second node N2. A second terminal of the second capacitor circuit 15 is coupled with a gate drive signal output terminal GOUT.

The second node control circuit 16 is coupled with the third node N3, the first level input terminal for inputting the first level V1, and the second node N2, respectively.

The output circuit 17 is coupled with the second node N2, the third node N3, the gate drive signal output terminal GOUT, a third clock signal input terminal CKC and the first level input terminal for inputting the first level V1, respectively.

The third node control circuit 18 is coupled with a fourth clock signal input terminal CKD, the second level input terminal for inputting the second level V2, the second node N2, and the third node N3, respectively.

In the shift register unit according to the embodiment of the present disclosure, by providing the first capacitor circuit 12, the first node control circuit 13 and the potential control circuit 14, the potential of the first node N1 can be controlled by the bootstrap function of the first capacitor module 12 at a second phase of each display cycle, so that under control of the first node N1, the potential control circuit 14 can better control the coupling between the second node N2 and the second level input terminal as compared with related art. In the shift register unit according to the embodiment of the present disclosure, due to the bootstrap function of the second capacitor circuit 15 at a third phase of each display cycle, the potential of the second node N2 at the third phase controls an output transistor included in the output circuit 17 to be turned on in a better manner, thereby improving driving capability of the output transistor and achieving normal transmission of signals at narrow pulse widths.

Figure 2:
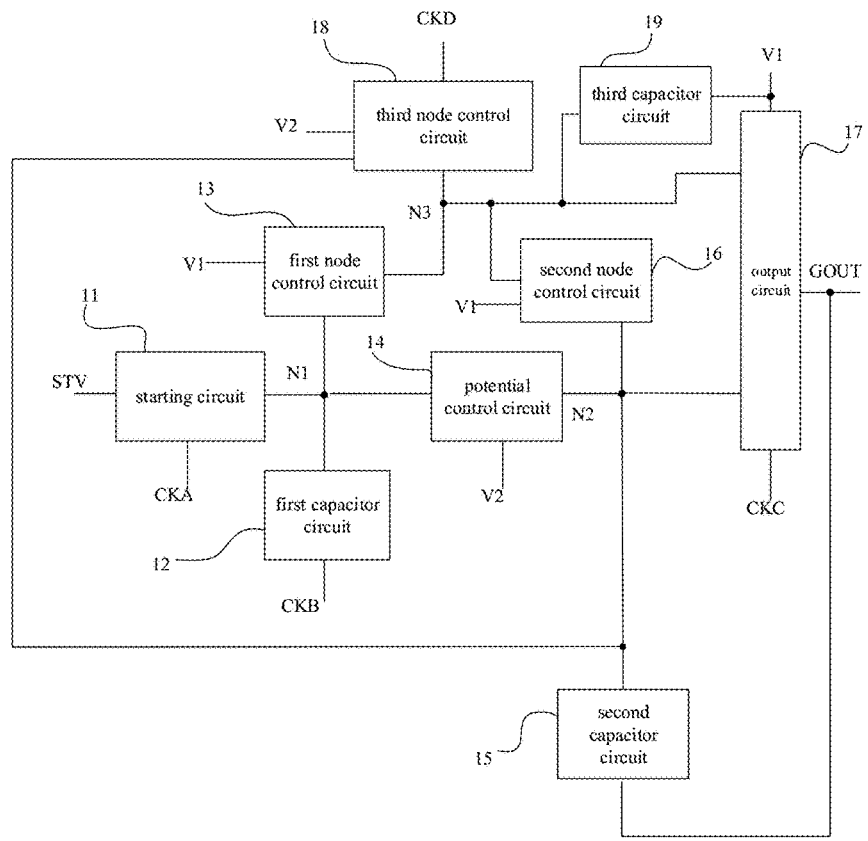
FIG. 2 is a schematic diagram of a shift register unit according to another embodiment of the present disclosure.

Optionally, as shown in FIG. 2, the shift register unit in the embodiment of the present disclosure may further include a third capacitor circuit 19. A first terminal of the third capacitor circuit 19 is coupled with the third node N3.

A second terminal of the third capacitor circuit 19 is coupled with the first level input terminal.

The second node control circuit 16 is configured to, under control of the third node N3, control turning on or off a coupling between the second node N2 and the first level input terminal for inputting the first level V1.

The third node control circuit 18 is configured to, under control of the second node N2, control turning on or off a coupling between the third node N3 and the fourth clock signal input terminal CKD.

The output circuit 17 is configured to, under control of the second node N2, control turning on or off a coupling between the gate drive signal output terminal GOUT and the third clock signal input terminal CKC. The output circuit 17 is further configured to, under control of the third node N3, control turning on or off a coupling between the gate drive signal output terminal GOUT and the first level input terminal for inputting the first level V1.

In some embodiments, the third capacitor circuit 19 in the shift register unit of the present disclosure can better maintain the potential of the third node.

Specifically, the starting circuit may include: a starting transistor. A gate electrode of the starting transistor is coupled with the first clock signal input terminal. A first electrode of the starting transistor is coupled with the first node. A second electrode of the starting transistor is coupled with the start voltage input terminal.

The first capacitor circuit may include a first capacitor. A first terminal of the first capacitor is coupled with the second clock signal input terminal. A second terminal of the first capacitor is coupled with the first node.

The first node control circuit may include a first node control transistor. A gate electrode of the first node control transistor is coupled with the third node. A first electrode of the first node control transistor is coupled with the first level input terminal. A second electrode of the first node control transistor is coupled with the first node.

The potential control circuit may include a potential control transistor. A gate electrode of the potential control transistor is coupled with the first node. A first electrode of the potential control transistor is coupled with the second node. A second electrode of the potential control transistor is coupled with the second level input terminal.

Specifically, the second capacitor circuit may include a second capacitor. A first terminal of the second capacitor is coupled with the second node. A second terminal of the second capacitor is coupled with the gate drive signal output terminal.

The second node control circuit may include a second node control transistor. A gate electrode of the second node control transistor is coupled with the third node. A first electrode of the second node control transistor is coupled with the first level input terminal. A second electrode of the second node control transistor is coupled with the second node.

The third node control circuit may include a first control transistor and a second control transistor. A gate electrode of the first control transistor is coupled with the fourth clock signal input terminal. A first electrode of the first control transistor is coupled with the third node. A second electrode of the first control transistor is coupled with the second level input terminal.

A gate electrode of the second control transistor is coupled with the second node. A first electrode of the second control transistor is coupled with the third node. A second electrode of the second control transistor is coupled with the fourth clock signal input terminal.

The output circuit may include a first output transistor and a second output transistor. A gate electrode of the first output transistor is coupled with the second node. A first electrode of the first output transistor is coupled with the gate drive signal output terminal. A second electrode of the first output transistor is coupled with the third clock signal input terminal.

A gate electrode of the second output transistor is coupled with the third node. A first electrode of the second output transistor is coupled with the first level input terminal. A second electrode of the second output transistor is coupled with the gate drive signal output terminal.

In some embodiments, the starting transistor, the first node control transistor, the potential control transistor, the second node control transistor, the first control transistor, the second control transistor, the first output transistor and the second output transistor may be p-type transistors. The first level input terminal is a high level input terminal, and the second level input terminal is a high level input terminal.

In other embodiments, the starting transistor, the first node control transistor, the potential control transistor, the second node control transistor, the first control transistor, the second control transistor, the first output transistor and the second output transistor may be n-type transistors. The first level input terminal is a low level input terminal, and the second level input terminal is a low level input terminal.

The shift register unit of the present disclosure will be described hereinafter with a specific embodiment.

Figure 3:
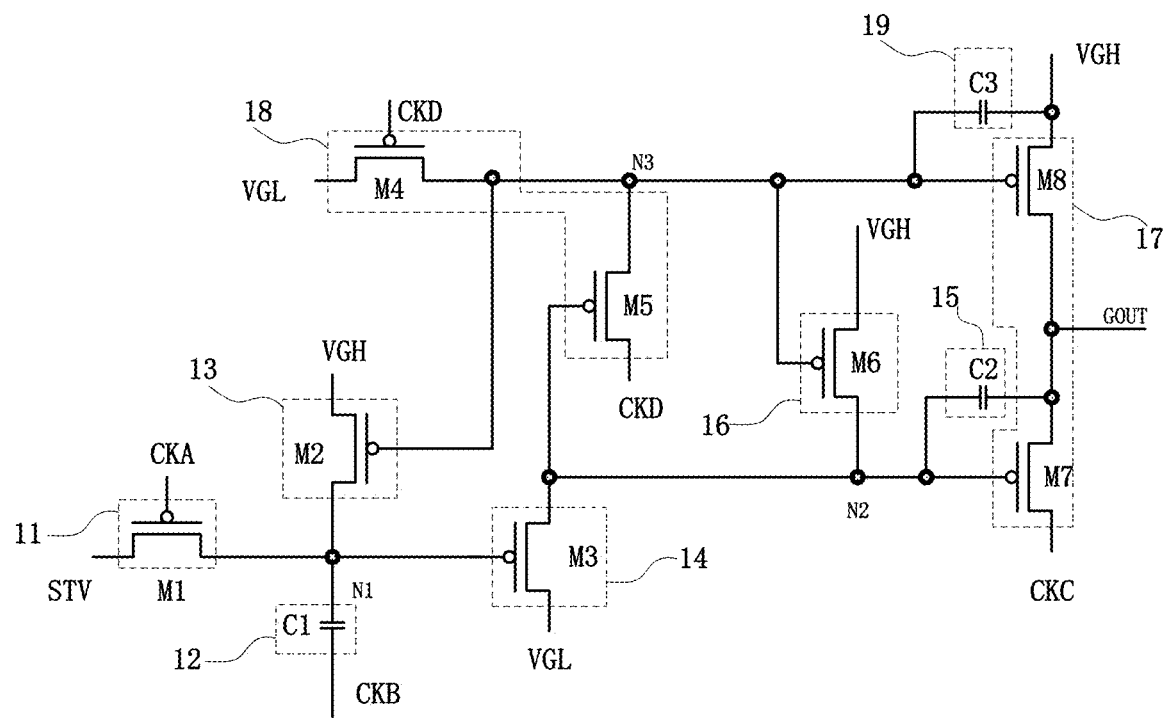
FIG. 3 is a circuit diagram of a shift register unit according to a specific embodiment of the present disclosure.

As shown in FIG. 3, in a specific embodiment of the present disclosure, the shift register unit includes a starting circuit 11, a first capacitor circuit 12, a first node control circuit 13, a potential control circuit 14, a second capacitor circuit 15, a second node control circuit 16, an output circuit 17, a third node control circuit 18, and a third capacitor circuit 19.

The starting circuit 11 includes a starting transistor M1. A gate electrode of the starting transistor M1 is coupled with the first clock signal input terminal CKA. A source electrode of the starting transistor M1 is coupled with the first node N1. A drain electrode of the starting transistor M1 is coupled with the start voltage input terminal STV.

The first capacitor circuit 12 includes a first capacitor C1. A first terminal of the first capacitor C1 is coupled with the second clock signal input terminal CKB. A second terminal of the first capacitor C1 is coupled with the first node N1.

The first node control circuit 13 includes a first node control transistor M2. A gate electrode of the first node control transistor M2 is coupled with the third node N3. A drain electrode of the first node control transistor M2 is coupled with a high level input terminal for inputting a high level VGH. A source electrode of the first node control transistor M2 is coupled with the first node N1.

The potential control circuit 14 includes a potential control transistor M3. A gate electrode of the potential control transistor M3 is coupled with the first node N1. A source electrode of the potential control transistor M3 is coupled with the second node N2. A drain electrode of the potential control transistor M3 is coupled with a low level input terminal for inputting a low level VGL.

The second capacitor circuit 15 includes a second capacitor C2. A first terminal of the second capacitor C2 is coupled with the second node N2. A second terminal of the second capacitor C2 is coupled with the gate drive signal output terminal GOUT.

The second node control circuit 16 includes a second node control transistor M6. A gate electrode of the second node control transistor M6 is coupled with the third node M3. A drain electrode of the second node control transistor M6 is coupled with the high level input terminal for inputting the high level VGH. A source electrode of the second node control transistor M6 is coupled with the second node N2.

The third node control circuit 18 includes a first control transistor M4 and a second control transistor M5. A gate electrode of the first control transistor M4 is coupled with the fourth clock signal input terminal CKD. A source electrode of the first control transistor M4 is coupled with the third node N3. A drain electrode of the first control transistor M4 is coupled with the low level input terminal for inputting the low level VGL.

A gate electrode of the second control transistor M5 is coupled with the second node N2. A source electrode of the second control transistor M5 is coupled with the third node N3. A drain electrode of the second control transistor M5 is coupled with the fourth clock signal input terminal CKD.

The output circuit 17 includes a first output transistor M7 and a second output transistor M8. A gate electrode of the first output transistor M7 is coupled with the second node N2. A source electrode of the first output transistor M7 is coupled with the gate drive signal output terminal GOUT. A drain electrode of the first output transistor M7 is coupled with the third clock signal input terminal CKC.

A gate electrode of the second output transistor M8 is coupled with the third node N3. A drain electrode of the second output transistor M8 is coupled with the high level input terminal for inputting the high level VGH. A source electrode of the second output transistor M8 is coupled with the gate drive signal output terminal GOUT.

The third capacitor circuit 19 includes a third capacitor C3. A first terminal of the third capacitor C3 is coupled with the third node N3. A second terminal of the third capacitor C3 is coupled with the high level input terminal for inputting the high level VGH.

In the embodiment shown in FIG. 3, all of the transistors are p-type transistors. In actual operations, the above transistors may also be replaced with n-type transistors, and the types of transistors are not limited herein.

In actual operations, GOUT is grounded through load resistors and load capacitors in series.

Figure 4:
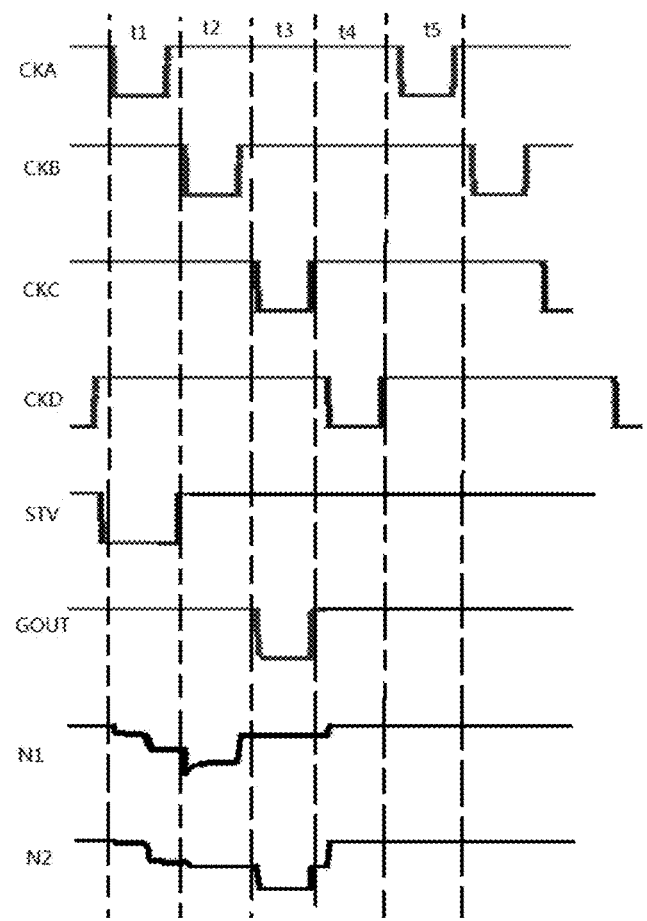
FIG. 4 is an operation timing diagram of the shift register unit shown in FIG. 3 according to a specific embodiment of the present disclosure.

As shown in FIG. 4, in the specific embodiment of the present disclosure, when the shift register unit works, as shown in FIG. 3, the following stages are included in each display cycle.

In the first stage t1, both STV and CKA input a low level VGL; CKB, CKC and CKD input a high level VGH; M1 is turned on, and the low level of the STV is transmitted to N1; since there is a threshold loss when the p-type transistor transmits the low level, the potential of N1 becomes VGL-Vth1, where Vth1 is a threshold voltage of the starting transistor included in the starting circuit (Vth1 is a negative value when M1 is a p-type transistor); M3 is turned on until the potential of N2 becomes VGL-Vth1-Vth2, where Vth2 is a threshold voltage of the potential control transistor included in the potential control circuit (Vth2 is a negative value when M2 is a p-type transistor); under control of N2, M7 is turned on, and GOUT is coupled with CKC, so that GOUT outputs the high level VGH; under control of N2, M5 is turned on to control N3 to be coupled with CKD, so that the potential of N3 is the high level VGH; under control of N3, M8 is turned off to control GOUT to be disconnected from the high level input terminal for inputting the high level VGH.

In the second stage t2, CKB inputs a low level VGL; STV, CKA, CKC and CKD input a high level VGH; since the potential of the first terminal of C1 is changed from VGH to VGL, the potential of N1 becomes 2VGL-Vth1-VGH accordingly; under control of N1, M3 is turned on to control N2 to be coupled with the low level input terminal for inputting the low level VGL, so that the potential of N2 is low level VGL; under control of N2, M7 is turned on to control the GOUT to be coupled with CKC, so that GOUT outputs the high level VGH; under control of N2, M5 is turned on to control N3 to be coupled with CKD, so that the potential of N3 is the high level VGH; under control of N3, M8 is turned off to control GOUT to be disconnected from the high level input terminal for inputting the high level VGH.

In the third stage t3, CKC inputs the low level VGL; STV, CKA, CKB and CKD input the high level VGH; since the potential of the first terminal of C1 is changed from VGL to VGH, the potential of N1 changes to VGL-Vth1 accordingly; under control of N1, M3 is turned off to control N2 to be disconnected from the low level input for inputting the low level VGL; under control of N2, M7 is turned on to control GOUT to be coupled with CKC, so that GOUT outputs the low level VGL; since the potential of the second terminal of C2 is changed from VGH to VGL, the potential of N2 jumps to 2VGL-VGH; under control of the second node N2, M5 is turned on to control N3 to be coupled with the CKD, so that the potential of N3 is at a high level VGH; under control of N3, M8 is turned off to control GOUT to be disconnected from the high level input terminal for inputting high level VGH.

In the fourth stage t4, CKD inputs the low level VGL; STV, CKA, CKB and CKC input a high level VGH; under control of CKD, M4 is turned on to control N3 to be coupled with the low level input terminal for inputting the low level VGL; under control of N3, M6 is turned on to control N2 to be coupled with the high level input terminal for inputting the high level VGH; under control of N2, M7 is turned off; under control of N3, M8 is turned on to control GOUT to output the high level VGH.

In the fifth stage t5, CKA inputs the low level VGL; STV, CKB, CKC and CKD all input the high level VGH; M1 is turned on, the high level of the STV is transmitted to N1, so that M3 is turned off, and the potential of N2 is still high level, the potential of N3 is still low level, M7 is turned off, M8 is turned on, and GOUT still outputs the high level VGH.

At the end of the fourth stage t4, GOUT still outputs the high level VGH until STV and CKA simultaneously input a low level again.

In the specific embodiment of the present disclosure, the shift register is provided with C1, M2, and M3, and unit utilizes twice bootstrap effect of the capacitors. The bootstrap effect of the first capacitor C1 in the second stage t2 enables the potential of N1 to control M3 to be better turned on, thereby enabling N2 to receive VGL. The bootstrap effect of the second capacitor C2 in the third stage t3 enables the potential of N2 to control the first output transistor M7 of the output circuit to be better turned on, thereby improving driving capability of the first output transistor M7 and achieving normal transmission of signals at narrow pulse widths.

As shown in FIG. 4, a duty ratio of a first clock signal input into the CKA, a duty ratio of a second clock signal input into the CKB, a duty ratio of a third clock signal input into the CKC and a duty ratio of a fourth clock signal input into the CKD each may be ¼.

The period of the first clock signal, the period of the second clock signal, the period of the third clock signal and the period of the fourth clock signal each may be T.

The second clock signal is delayed by T/4 from the first clock signal, the third clock signal is delayed by T/4 from the second clock signal, and the fourth clock signal is delayed by T/4 from the third clock signal.

One embodiment of the present disclosure provides a method for driving a shift register unit, which may be used to drive the above shift register unit. The method for driving the shift register unit includes the following stages in each display period.

In the first stage, each of the start signal input terminal and the first clock signal input terminal receives the second level V2; each of the second clock signal input terminal, the third clock signal input terminal and the fourth clock signal input terminal receives the first level V1; the starting circuit controls the start signal input terminal to be coupled with the first node until the potential of the first node becomes V2-Vth1, where Vth1 is a threshold voltage of the starting transistor included in the starting circuit; under control of the first node, the potential control circuit controls the second node to be coupled with the second level input terminal, until the potential of the second node becomes V2-Vth1-Vth2, where Vth2 is a threshold voltage of the potential control transistor included in the potential control circuit; under control of the second node, the output circuit controls the gate drive signal output terminal to be coupled with the third clock signal input terminal so that the gate drive signal output terminal outputs the first level V1.

In the second stage, the second clock signal input terminal receives the second level V2; each of the start signal input terminal, the first clock signal input terminal, the third clock signal input terminal and the fourth clock signal input terminal receives the first level V1; since the potential of the first terminal of the first capacitor circuit is changed from V1 to V2, the potential of the first node becomes 2V2-Vth1-V1; under control of the first node, the potential control circuit controls the second node to be coupled with the second level input terminal, so that the potential of the second node is the second level V2; under control of the second node, the output circuit controls the gate drive signal output terminal to be coupled with the third clock signal input terminal, so that the gate drive signal output terminal outputs the first level V1.

In the third stage, the third clock signal input terminal receives the second level V2; each of the start signal input terminal, the first clock signal input terminal, the second clock signal input terminal and the fourth clock signal input terminal receives the first level V1; since the potential of the first terminal of the first capacitor circuit is changed from V2 to V1, so that the potential of the first node becomes V2-Vth1; under control of the first node, the potential control circuit controls the second node to be disconnected from the second level input terminal; under control of the second node, the output circuit controls the gate drive signal output terminal to be coupled with the third clock signal input terminal, so that the gate drive signal output terminal outputs the second level V2; since the potential of the second terminal of the second capacitor circuit is changed from V1 to V2, the potential of the second node jumps to 2V2-V1.

In the fourth stage, the fourth clock signal input terminal receives the second level V2; each of the start signal input terminal, the first clock signal input terminal, the second clock signal input terminal and the third clock signal input terminal receives the first level V1; under control of the fourth clock signal input terminal, the third node control circuit controls the third node to be coupled with the second level input terminal; under control of the third node, the second node control circuit controls the second node to be coupled with the first level input terminal; under control of the third node, the output circuit controls the gate drive signal output terminal to output the first level V1.

In the method for driving the gate driving circuit according to the embodiment of the present disclosure, the potential of the first node is controlled by the bootstrap action of the first capacitor circuit in the second stage of each display period, so that under control of the first node, the potential control circuit can better control the coupling between the second node and the second level input terminal as compared with the related art. In the shift register unit according to the embodiment of the present disclosure, the bootstrap action of the second capacitor circuit 15 in the third stage of each display period can enable the potential of the second node N2 to better control the output transistor of the output circuit to be better turned on in the third stage, thereby improving driving capability of the output transistor included in the output circuit and achieving normal transmission of signals at narrow pulse widths.

Specifically, the method for driving the gate driving circuit according to the embodiment of the present disclosure further includes:

in the first stage, the second stage and the third stage, under control of the second node, the third node control circuit controls the third node to be coupled with the fourth clock signal input terminal, thereby enabling the potential of the third node to be the first level V1; under control of the third node, the output circuit controls the gate drive signal output terminal to be disconnected from the first level input terminal.

Specifically, a duty ratio of a first clock signal input into the first clock signal input terminal, a duty ratio of a second clock signal input into the second clock signal input terminal, a duty ratio of a third clock signal input into the third clock signal input terminal and a duty ratio of a fourth clock signal input into the fourth clock signal input terminal each may be ¼.

The period of the first clock signal, the period of the second clock signal, the period of the third clock signal and the period of the fourth clock signal each may be T.

The second clock signal is delayed by T/4 from the first clock signal, the third clock signal is delayed by T/4 from the second clock signal, and the fourth clock signal is delayed by T/4 from the third clock signal.

One embodiment of the present disclosure provides a gate driving circuit which includes M cascaded shift register units; M is an integer greater than 1.

In the M cascaded shift register units, operations of the (4N+1)-th shift register unit, the (4N+2)-th shift register unit, the (4N+3)-th shift register unit and the (4N+4)-th shift register unit are described as follows, where N is an integer greater than or equal to zero, and (4N+4) is less than or equal to the M.

A first clock signal input terminal of the (4N+1)-th shift register unit receives a first clock signal; a second clock signal input terminal of the (4N+1)-th shift register unit receives a second clock signal; a third clock signal input terminal of the (4N+1)-th shift register unit receives a third clock signal; a fourth clock signal input terminal of the (4N+1)-th shift register unit receives a fourth clock signal.

At this point, a first clock signal input terminal of the (4N+2)-th shift register unit receives a second clock signal; a second clock signal input terminal of the (4N+2)-th shift register unit receives a third clock signal; a third clock signal input terminal of the (4N+2)-th shift register unit receives a fourth clock signal; a fourth clock signal input terminal of the (4N+2)-th shift register unit receives a first clock signal.

Meanwhile, a first clock signal input terminal of the (4N+3)-th shift register unit receives a third clock signal; a second clock signal input terminal of the (4N+3)-th shift register unit receives a fourth clock signal; a third clock signal input terminal of the (4N+3)-th shift register unit receives a first clock signal; a fourth clock signal input terminal of the (4N+3)-th shift register unit receives a second clock signal.

At the same time, a first clock signal input terminal of the (4N+4)-th shift register unit receives a fourth clock signal; a second clock signal input terminal of the (4N+4)-th shift register unit receives a first clock signal; a third clock signal input terminal of the (4N+4)-th shift register unit receives a second clock signal; a fourth clock signal input terminal of the (4N+4)-th shift register unit receives a third clock signal.

One embodiment of the present disclosure provides a display device which includes the above gate driving circuit.

The display device according to the embodiment of the present disclosure may include a liquid crystal display device such as a liquid crystal panel, a liquid crystal television, a mobile phone, or a liquid crystal displayer. In addition to the liquid crystal display device, the embodiments of the present disclosure may also include an organic light emitting display device or other type of display device such as an electronic reader.

The above are merely the preferred embodiments of the present disclosure. It should be noted that, a person skilled in the art may make improvements and modifications without departing from the principle of the present disclosure, and these improvements and modifications shall also fall within the scope of the present disclosure.

What is claimed is:

1. A shift register unit, comprising:
    a starting circuit coupled with a first clock signal input terminal, a first node and a start voltage input terminal, respectively; wherein the starting circuit is configured to, under control of the first clock signal input terminal, control turning on or off coupling between the first node and the start voltage input terminal;
    a first capacitor circuit with a first terminal coupled with a second clock signal input terminal and a second terminal coupled with the first node;
    a first node control circuit coupled with a third node, a first level input terminal and the first node, respectively; wherein the first node control circuit is configured to, under control of the third node, control turning on or off coupling between the first node and the first level input terminal;
    a potential control circuit coupled with the first node, a second level input terminal and a second node, respectively; wherein the potential control circuit is configured to, under control of the first node, control turning on or off coupling between the second node and the second level input terminal;
    a second capacitor circuit with a first terminal coupled with the second node and a second terminal coupled with a gate drive signal output terminal;
    a second node control circuit coupled with the third node, the first level input terminal and the second node, respectively;
    an output circuit coupled with the second node, the third node, the gate drive signal output terminal, a third clock signal input terminal and the first level input terminal, respectively; and
    a third node control circuit coupled with a fourth clock signal input terminal, the second level input terminal, the second node and the third node, respectively.

2. The shift register unit of claim 1, further comprising a third capacitor circuit; wherein a first terminal of the third capacitor circuit is coupled with the third node; a second terminal of the third capacitor circuit is coupled with the first level input terminal;
    the second node control circuit is configured to, under control of the third node, control turning on or off coupling between the second node and the first level input terminal;
    the third node control circuit is configured to, under control of the second node, control turning on or off coupling between the third node and the fourth clock signal input terminal;
    the output circuit is configured to, under control of the second node, control turning on or off coupling between the gate drive signal output terminal and the third clock signal input terminal; under control of the third node, control turning on or off coupling between the gate drive signal output terminal and the first level input terminal.

3. The shift register unit of claim 2, wherein the starting circuit includes: a starting transistor; a gate electrode of the starting transistor is coupled with the first clock signal input terminal; a first electrode of the starting transistor is coupled with the first node; and a second electrode of the starting transistor is coupled with the start voltage input terminal.

4. The shift register unit of claim 3, wherein the first capacitor circuit includes a first capacitor; a first terminal of the first capacitor is coupled with the second clock signal input terminal; and a second terminal of the first capacitor is coupled with the first node.

5. The shift register unit of claim 4, wherein the first node control circuit includes a first node control transistor; a gate electrode of the first node control transistor is coupled with the third node; a first electrode of the first node control transistor is coupled with the first level input terminal; and a second electrode of the first node control transistor is coupled with the first node.

6. The shift register unit of claim 5, wherein the potential control circuit includes a potential control transistor; a gate electrode of the potential control transistor is coupled with the first node; a first electrode of the potential control transistor is coupled with the second node; and a second electrode of the potential control transistor is coupled with the second level input terminal.

7. The shift register unit of claim 6, wherein the second capacitor circuit includes a second capacitor; a first terminal of the second capacitor is coupled with the second node; and a second terminal of the second capacitor is coupled with the gate drive signal output terminal.

8. The shift register unit of claim 7, wherein the second node control circuit includes a second node control transistor; a gate electrode of the second node control transistor is coupled with the third node; a first electrode of the second node control transistor is coupled with the first level input terminal; and a second electrode of the second node control transistor is coupled with the second node.

9. The shift register unit of claim 8, wherein the third node control circuit includes a first control transistor and a second control transistor; a gate electrode of the first control transistor is coupled with the fourth clock signal input terminal; a first electrode of the first control transistor is coupled with the third node; and a second electrode of the first control transistor is coupled with the second level input terminal;
    a gate electrode of the second control transistor is coupled with the second node; a first electrode of the second control transistor is coupled with the third node; and a second electrode of the second control transistor is coupled with the fourth clock signal input terminal.

10. The shift register unit of claim 9, wherein the output circuit includes a first output transistor and a second output transistor; a gate electrode of the first output transistor is coupled with the second node; a first electrode of the first output transistor is coupled with the gate drive signal output terminal; and a second electrode of the first output transistor is coupled with the third clock signal input terminal;

a gate electrode of the second output transistor is coupled with the third node; a first electrode of the second output transistor is coupled with the first level input terminal; and a second electrode of the second output transistor is coupled with the gate drive signal output terminal.

11. The shift register unit according to claim 10, wherein the starting transistor, the first node control transistor, the potential control transistor, the second node control transistor, the first control transistor, the second control transistor, the first output transistor and the second output transistor are p-type transistors; the second level input terminal is a low level input terminal; and the first level input terminal is a high level input terminal.

12. The shift register unit according to claim 10, wherein the starting transistor, the first node control transistor, the potential control transistor, the second node control transistor, the first control transistor, the second control transistor, the first output transistor and the second output transistor are n-type transistors; the second level input terminal is a high level input terminal; and the first level input terminal is a low level input terminal.

13. A method for driving the shift register unit according to claim 1, comprising: in each display period, in a first stage, each of the start signal input terminal and the first clock signal input terminal receives a second level V2; each of the second clock signal input terminal, the third clock signal input terminal and the fourth clock signal input terminal receives a first level V1; the starting circuit controls the start signal input terminal to be coupled with the first node until a potential of the first node becomes V2-Vth1, where Vth1 is a threshold voltage of a starting transistor included in the starting circuit; under control of the first node, the potential control circuit controls the second node to be coupled with the second level input terminal, until a potential of the second node becomes V2-Vth1-Vth2, where Vth2 is a threshold voltage of a potential control transistor included in the potential control circuit; under control of the second node, the output circuit controls the gate drive signal output terminal to be coupled with the third clock signal input terminal, thereby enabling the gate drive signal output terminal to outputs the first level;

in a second stage, the second clock signal input terminal receives the second level V2; each of the start signal input terminal, the first clock signal input terminal, the third clock signal input terminal and the fourth clock signal input terminal receives the first level V1; since the potential of the first terminal of the first capacitor circuit is changed from V1 to V2, the potential of the first node becomes 2V2-Vth1-V1; under control of the first node, the potential control circuit controls the second node to be coupled with the second level input terminal, thereby enabling the potential of the second node to be the second level V2; under control of the second node, the output circuit controls the gate drive signal output terminal to be coupled with the third clock signal input terminal, thereby enabling the gate drive signal output terminal to output the first level V1;

in a third stage, the third clock signal input terminal receives the second level V2; each of the start signal input terminal, the first clock signal input terminal, the second clock signal input terminal and the fourth clock signal input terminal receives the first level V1; since the potential of the first terminal of the first capacitor circuit is changed from V2 to V1, so that the potential of the first node becomes V2-Vth1; under control of the first node, the potential control circuit controls the second node to be disconnected from the second level input terminal; under control of the second node, the output circuit controls the gate drive signal output terminal to be coupled with the third clock signal input terminal, so that the gate drive signal output terminal outputs the second level V2; since the potential of the second terminal of the second capacitor circuit is changed from V1 to V2, the potential of the second node jumps to 2V2-V1; and in a fourth stage, the fourth clock signal input terminal receives the second level V2; each of the start signal input terminal, the first clock signal input terminal, the second clock signal input terminal and the third clock signal input terminal receives the first level V1; under control of the fourth clock signal input terminal, the third node control circuit controls the third node to be coupled with the second level input terminal; under control of the third node, the second node control circuit controls the second node to be coupled with the first level input terminal; under control of the third node, the output circuit controls the gate drive signal output terminal to output the first level V1.

14. The method according to claim 13, further comprising: in the first stage, the second stage and the third stage, under control of the second node, the third node control circuit controls the third node to be coupled with the fourth clock signal input terminal, thereby enabling the potential of the third node to be the first level V1; under control of the third node, the output circuit controls the gate drive signal output terminal to be disconnected from the first level input terminal.

15. The method according to claim 13, wherein each of a duty ratio of a first clock signal input into the first clock signal input terminal, a duty ratio of a second clock signal input into the second clock signal input terminal, a duty ratio of a third clock signal input into the third clock signal input terminal and a duty ratio of a fourth clock signal input into the fourth clock signal input terminal is ¼;

each of a period of the first clock signal, a period of the second clock signal, a period of the third clock signal and a period of the fourth clock signal is T;

the second clock signal is delayed by T/4 from the first clock signal, the third clock signal is delayed by T/4 from the second clock signal, and the fourth clock signal is delayed by T/4 from the third clock signal.

16. A gate driving circuit comprising M cascaded shift register units according to claim 1, wherein M is an integer greater than one.

17. A method for driving a gate driving circuit which includes M cascaded shift register units according to claim 1, wherein M is an integer greater than one;

the method includes:

for a (4N+1)-th shift register unit, a (4N+2)-th shift register unit, a (4N+3)-th shift register unit and a (4N+4)-th shift register unit in the M cascaded shift register units, where N is an integer greater than or equal to zero, and (4N+4) is less than or equal to the M, a first clock signal input terminal of the (4N+1)-th shift register unit receives a first clock signal; a second clock signal input terminal of the (4N+1)-th shift register unit receives a second clock signal; a third clock signal input terminal of the (4N+1)-th shift register unit receives a third clock signal; a fourth clock signal input terminal of the (4N+1)-th shift register unit receives a fourth clock signal;

a first clock signal input terminal of the (4N+2)-th shift register unit receives the second clock signal; a second clock signal input terminal of the (4N+2)-th shift register unit receives the third clock signal; a third clock signal input terminal of the (4N+2)-th shift register unit receives the fourth clock signal; a fourth clock signal input terminal of the (4N+2)-th shift register unit receives the first clock signal;

a first clock signal input terminal of the (4N+3)-th shift register unit receives the third clock signal; a second clock signal input terminal of the (4N+3)-th shift register unit receives the fourth clock signal; a third clock signal input terminal of the (4N+3)-th shift register unit receives the first clock signal; a fourth clock signal input terminal of the (4N+3)-th shift register unit receives the second clock signal; and a first clock signal input terminal of the (4N+4)-th shift register unit receives the fourth clock signal; a second clock signal input terminal of the (4N+4)-th shift register unit receives the first clock signal; a third clock signal input terminal of the (4N+4)-th shift register unit receives the second clock signal; a fourth clock signal input terminal of the (4N+4)-th shift register unit receives the third clock signal.

18. A display device comprising the gate driving circuit of claim 16.

* * * * *